United States Patent [19]

Kutsuzawa et al.

[11] Patent Number: 5,688,411
[45] Date of Patent: Nov. 18, 1997

[54] METHOD OF AND APPARATUS FOR REMOVING COATING FROM EDGE OF SUBSTRATE

[75] Inventors: Junji Kutsuzawa; Yoshihito Kai; Hidenori Miyamoto; Futoshi Shimai, all of Kanagawa, Japan

[73] Assignee: Tokyo Ohka Kogyo Co., Ltd., Kanagawa, Japan

[21] Appl. No.: 612,723

[22] Filed: Mar. 8, 1996

[30] Foreign Application Priority Data

Mar. 9, 1995 [JP] Japan .................................. 7-050106

[51] Int. Cl.⁶ .......................... H01L 21/30; B05D 3/00; B44C 1/22
[52] U.S. Cl. .......................... 216/92; 216/83; 156/640.1; 156/345; 134/32; 134/33
[58] Field of Search ............................ 216/92, 91, 83; 156/640.1, 345; 134/32, 33

[56] References Cited

U.S. PATENT DOCUMENTS

| 4,439,244 | 3/1984 | Allevato | 134/33 |
| 4,510,176 | 4/1985 | Cuthbert et al. | 427/82 |

FOREIGN PATENT DOCUMENTS

| 5-114555 | 5/1993 | Japan . | |
| 5-166720 | 7/1993 | Japan . | |
| 5-175117 | 7/1993 | Japan | H01L 21/027 |
| 5-200350 | 8/1993 | Japan . | |
| 6-45302 | 2/1994 | Japan . | |

*Primary Examiner*—R. Bruce Breneman
*Assistant Examiner*—Michael E. Adjodha
*Attorney, Agent, or Firm*—Weiner, Carrier, Burt & Esser, P.C.; Joseph P. Carrier; Irving M. Weiner

[57] ABSTRACT

A removing unit for removing coating from the edge of a substrate has a vertical unit body housing a pair of pipes connected to a solvent reservoir and having respective solvent supply parts. The unit body has a head disposed in an upper end portion thereof. The head has a horizontal slot which opens at opposite ends thereof and at one side thereof for receiving an edge of a substrate. Solvent is supplied into the slot, drawn therealong and discharged from an end of the slot, all in a contained manner. A edge of a substrate is horizontally inserted into the slot so as to be immersed in the solvent contained in the slot, and the unit body is moved along the substrate edge so that the solvent cleans undesired coating from the edge.

22 Claims, 7 Drawing Sheets

FIG. 8 (a) PRIOR ART
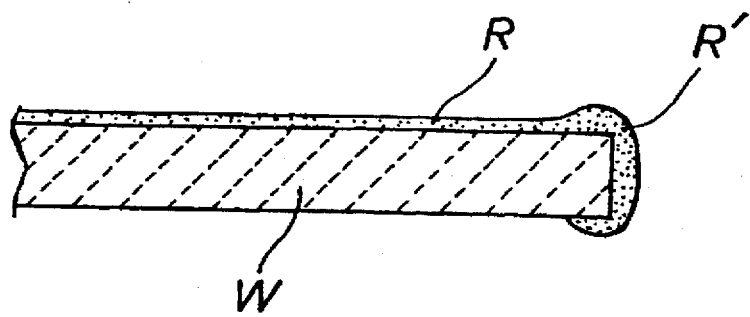
FIG. 8 (b) PRIOR ART
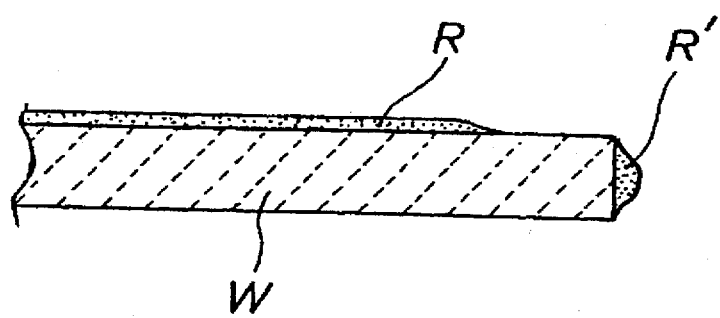
FIG. 8 (c)
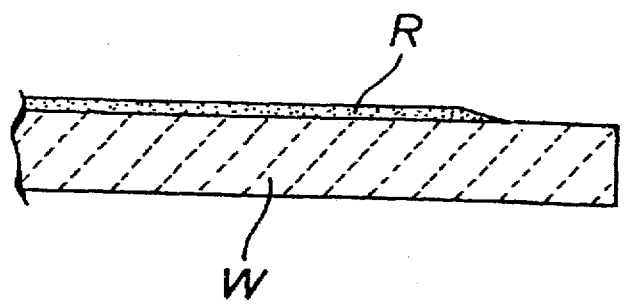

METHOD OF AND APPARATUS FOR REMOVING COATING FROM EDGE OF SUBSTRATE

BACKGROUND OF THE INVENTION

1. Field of the Invention

The present invention relates to a method of and an apparatus for removing a coating from an edge of a substrate such as a glass substrate, a semiconductor wafer, or the like.

2. Description of the Relevant Art

The process of forming an integrated circuit on a substrate includes the step of forming a photoresist film on the substrate by spreading a dropped photoresist solution uniformly over the substrate upon rotation of the substrate.

According to the above step of forming a photoresist film on the substrate, as shown in FIG. 8(a) of the accompanying drawings, the resist film, indicated by R, includes a thick edge portion R' deposited on an edge of the substrate, indicated by W. When the resist film R is removed after being etched, the thick edge portion R' is left on the edge of the substrate W. In subsequent steps, the remaining edge portion R' becomes a source of small particles which are deposited on the surface of the substrate W, resulting in a poor yield of integrated circuits. This problem also occur with the formation of an SOG film on a substrate.

There have heretofore been proposed various methods and apparatus for removing a coating from an edge of a substrate. For example, apparatus for removing a photoresist from an edge of a rectangular glass substrate are disclosed in Japanese laid-open patent publications Nos. 5-114555, 5-175117, and 5-200350, and apparatus for removing a photoresist from an edge of a semiconductor wafer are disclosed in Japanese laid-open patent publications Nos. 5-166720 and 6-45302.

According to the apparatus disclosed in Japanese laid-open patent publications Nos. 5-114555 and 5-175117, a nozzle for ejecting a solvent to dissolve a photoresist is moved along an edge of a rectangular glass substrate.

The apparatus disclosed in Japanese laid-open patent publication No. 5-200350 has a nozzle for ejecting a dissolving solvent which is positioned below a rectangular glass substrate. In operation, the dissolving solvent is applied from the nozzle to the reverse side of the rectangular glass substrate to remove a photoresist from an edge thereof.

The apparatus disclosed in Japanese laid-open patent publication No. 5-166720 includes a nozzle having a solvent dropping port and a gas supply port which are defined in an upper arm thereof and a suction port defined in a lower arm thereof. When the apparatus is in operation, an edge of a semiconductor wafer, from which a photoresist coating is to be removed, is positioned in the nozzle between the upper and lower arm thereof.

According to the apparatus disclosed in Japanese laid-open patent publication No. 6-45302, a photoresist on upper and lower surfaces of an edge of a semiconductor wafer is removed by a solvent ejected from nozzles positioned above and below the edge of the semiconductor wafer, and a photoresist on an outer surface of the edge of the semiconductor wafer is removed by a rotary brush that is held against the outer surface of the edge of the semiconductor wafer.

In any of the above conventional arrangements, the dissolving solvent is continuously ejected from the nozzle, and hence a large amount of dissolving solution is required to process the edges of substrates. Even when the ejected dissolving solvent is retrieved, the amount of retrieved dissolving solvent is relatively small, and the retrieved dissolving solvent is largely degraded. Therefore, the process of retrieving the ejected dissolving solvent is not cost-effective.

The efforts disclosed in the above publications except the apparatus disclosed in Japanese laid-open patent publication No. 6-45302 fail to sufficiently remove the remaining photoresist from the outer surface of the edge the substrate though they can remove the photoresist from the upper and lower surfaces of the edge of the substrate. As a result, the thick edge portion R' partly remains on the outer surface of the edge of the substrate, as shown in FIG. 8(b) of the accompanying drawings, after the edge of the substrate has been cleaned by the apparatus disclosed in the former four publications. According to Japanese laid-open patent publication No. 6-45302, since the remaining photoresist is scraped off the outer surface of the edge of the substrate by the rotary brush, the disclosed apparatus requires two different removing mechanisms, i.e., the nozzles and the rotary brush, and hence is complex in overall structure. Furthermore, the remaining photoresist cannot completely be removed from the outer surface of the edge of the substrate by the rotary brush.

SUMMARY OF THE INVENTION

It is therefore an object of the present invention to provide a method of and an apparatus for removing a coating from an edge of a substrate highly effectively with a relatively small amount of solvent.

According to the present invention, there is provided a method of removing a coating from an edge of a substrate, comprising the steps of passing a solvent in a slot in a removing unit, horizontally inserting an edge of a substrate in the slot, and thereafter, moving the removing unit along the edge of the substrate to remove a coating from the edge of the substrate. The solvent may be passed in the slot in a direction which is the same as a direction in which the removing unit is moved along the edge of the substrate.

The substrate may be of a rectangular shape, and the method may further comprise the steps of moving the removing unit toward the substrate until an edge of the substrate is inserted horizontally into the slot thereafter, moving the removing unit along the edge of the substrate to remove a coating from the edge of the substrate, moving the removing unit away from the substrate, turning the substrate by 90°, moving the removing unit toward the substrate until another edge of the substrate is inserted horizontally into the slot, and thereafter, moving the removing unit along the other edge of the substrate to remove a coating from the other edge of the substrate.

Alternatively, the substrate may be of a circular shape including a linear orientation flat edge and an actuate edge contiguous thereto, and the method may further comprise the steps of moving the removing unit along the linear orientation flat edge of the substrate to remove a coating from the linear orientation flat edge while the substrate is being held at rest, and rotating the substrate to allow the removing unit to remove a coating from the arcuate edge of the substrate while the removing unit is being held at rest.

The method may further comprise the step of applying a drying gas to the edge of the substrate downstream Of the slot with respect to a direction in which the removing unit is moved along the edge of the substrate.

According to the present invention, there is also provided an apparatus for removing a coating from an edge of a substrate, comprising a base, a substrate holder mounted on the base, for holding a substrate, and a removing unit for removing a coating from an edge of the substrate, the removing unit being mounted on the base for movement toward and away from the substrate holder, the removing unit having a slot for horizontally receiving the edge of the substrate, and a solvent supply port opening into the slot for supplying a solvent into the slot to dissolve and remove a coating from the edge of the substrate which is horizontally received in the slot, and means for drawing the solution in and along the slot.

The apparatus may further comprise means on the base for guiding the removing unit to move along the edge of the substrate which is horizontally received in the slot. The removing unit may comprise a unit body movably mounted on the base and a pair of arms extending from the unit body in opposite directions, respectively, the slot being defined in the arms, and a pair of solvent discharge pipes connected to distal ends of the arms in communication with the slot, the solvent supply port being defined in the unit body. The unit body may have a gas discharge port defined therein in communication with the slot, for applying a drying gas to the edge of the substrate.

According to the present invention, there is further provided an apparatus for removing a coating from an edge of a substrate, comprising a substrate holder for holding a substrate, a removing unit for removing a coating an edge of the substrate which is held by the substrate holder, the removing unit having a slot for horizontally receiving the edge of the substrate, and a solvent supply port opening into the slot for supplying a solvent into the slot to dissolve and remove a coating from the edge of the substrate which is horizontally received in the slot, and means for guiding the removing unit to move along the edge of the substrate while the solvent supplied from the solvent supply port is being applied to the edge of the substrate in the slot.

The removing unit may have a gas discharge port for applying a drying gas to the edge of the substrate downstream of the slot with respect to a direction in which the removing unit in moved along the edge of the substrate.

The slot in which the edge of the substrate horizontally received is supplied with a fresh solvent at all times, and the coating on the edge of the substrate is removed by the supplied solvent in the slot. Thereafter, the solvent is discharged from the slot and retrieved.

The above and further objects, details and advantages of the present invention will become apparent from the following detailed description of preferred embodiments thereof, when read in conjunction with the accompanying drawings.

BRIEF DESCRIPTION OF THE DRAWINGS

FIG. 8(a) is a fragmentary cross-sectional view of an edge of a substrate before a coating is removed therefrom;

FIG. 8(b) is a fragmentary cross-sectional view of an edge of a substrate on which a coating partly remains after the edge of the substrate has been cleaned; and FIG. 8(c) is a fragmentary cross-sectional view of an edge of a substrate from which a coating is removed by the apparatus according to the present invention.

DETAILED DESCRIPTION OF THE PREFERRED EMBODIMENTS

Figure 1:
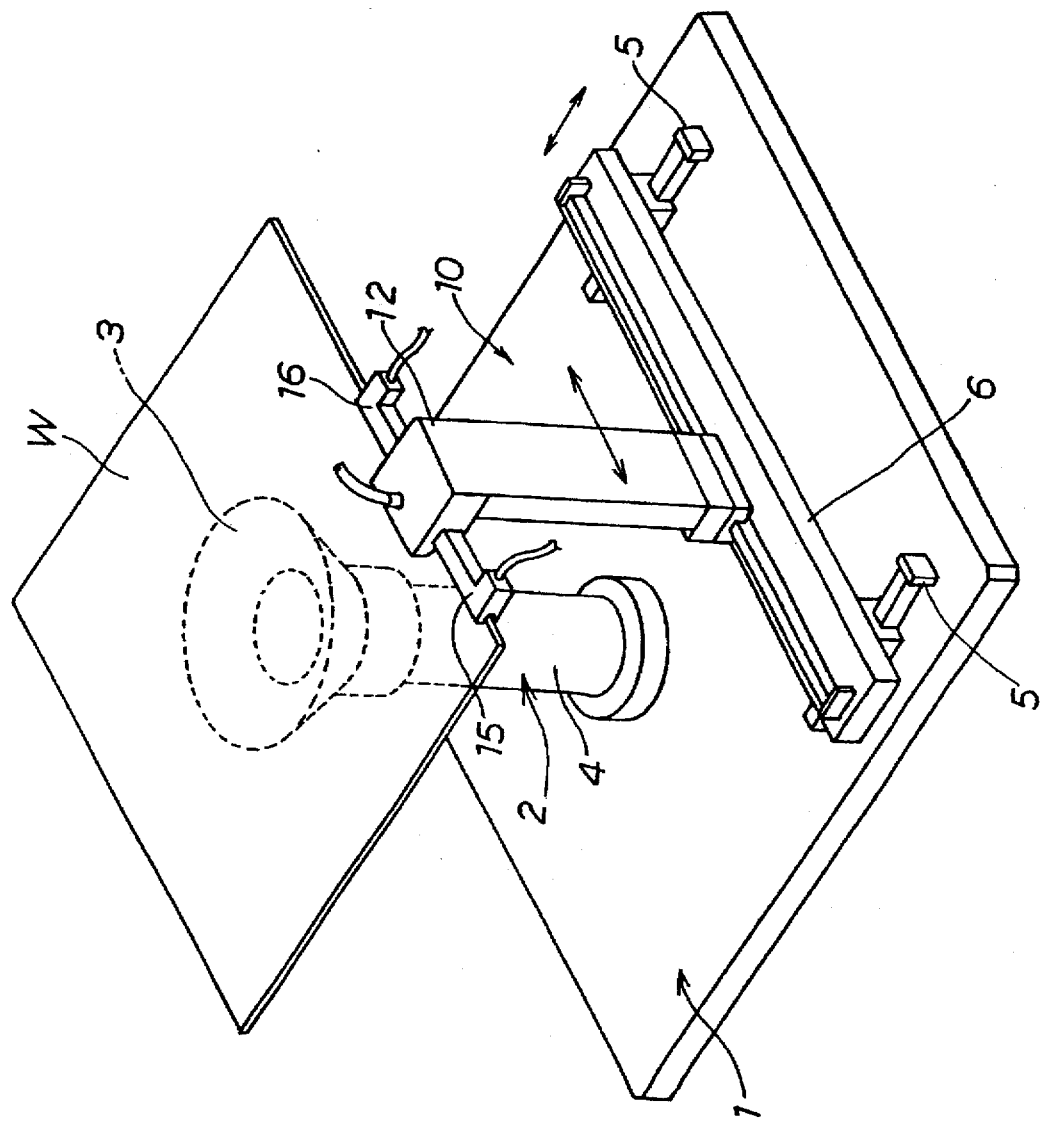
FIG. 1 is a perspective view of an apparatus for removing a coating from an edge of a substrate according to the present invention.

As shown in FIG. 1, an apparatus for removing a coating from an edge of a substrate according to the present invention comprises an upstanding substrate holder 2 mounted on a base 1 and a removing unit 10 movably mounted on the base 1 in spaced-apart relation to the substrate holder 2. The substrate holder 2 comprises a vacuum chuck 3 for securely holding a lower surface of a substrate W and a shaft 4 for rotating the vacuum chuck 3 about its own vertical axis. A pair of spaced linear guide rails 5 is mounted on the base 1 remotely from the substrate holder 2, and a linear guide rail 6 is movably supported on the linear guide rails 5 for movement toward and away from the substrate holder 2. The removing unit 10 is movably supported on the linear guide rail 6 for movement along the linear guide rail 6 perpendicularly to the linear guide rails 5. The substrate supported by the vacuum chuck 3, which serves as a basis for fabricating integrated circuits or the like thereof, is of a rectangular shape having four side edges, one of which extends above and parallel to the linear guide rail 6. Therefore, when the removing unit 10 moves along the linear guide rail 6, the removing unit 10 also moves along the one of the edges of the substrate W.

Figure 2:
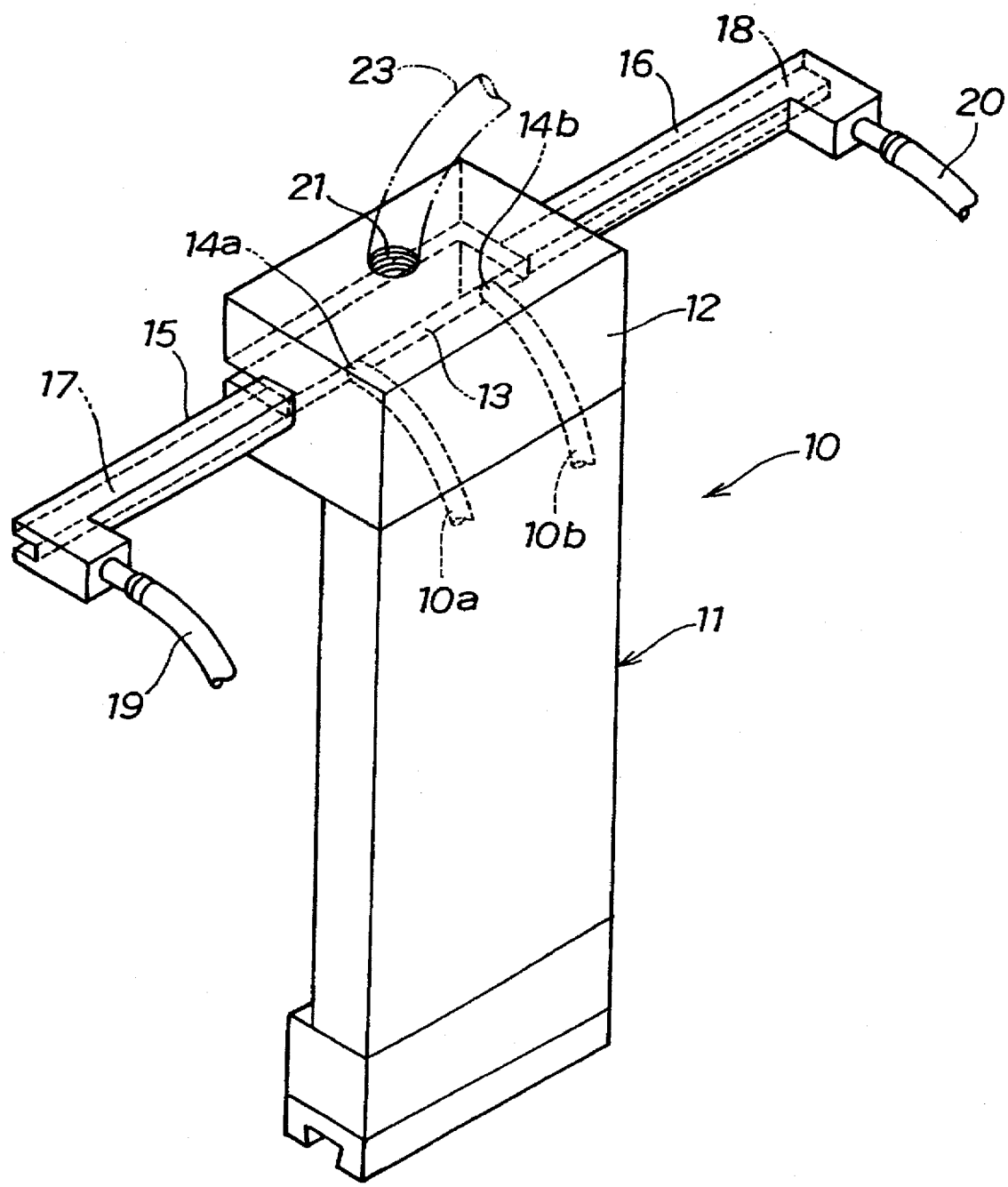
FIG. 2 is an enlarged perspective view of a removing unit of the apparatus shown in FIG. 1.

As shown in FIG. 2, the removing unit 10 has a vertical unit body 11 extending upwardly from the linear guide rail 6 and housing a pair of pipes 10a, 10b connected to a solvent reservoir (not shown). The unit body 11 has a head 12 disposed in an upper end portion thereof. The head 12 has a horizontal slot 13 which opens at opposite ends thereof and at one side thereof for receiving the one of the edges of the substrate W. The pipes 10a, 10b extend into the head 12 and have respective solvent supply ports 14a, 14b opening into the slot 13.

Two arms 15, 16 are attached at respective ends to the opposite ends of the head 12 and extend away from each other. The arms 15, 16 have respective slots 17, 18 defined therein and opening toward the substrate W. The slots 17, 18 communicate with the slot 13 at the respective opposite ends of the head 12. The outer ends of the arms 15, 16 are connected to respective solvent discharge pipes 19, 20 which communicate with the respective slots 27, 18. The solvent discharge pipes 19, 20 are connected to a suction device (not shown). A Solvent supplied from the solvent supply ports 14a, 14b cleans the edge of the substrate W, as described later on, and then flows through the slots 17, 18, and is discharged from the solvent discharge pipes 19, 20.

Figure 3:
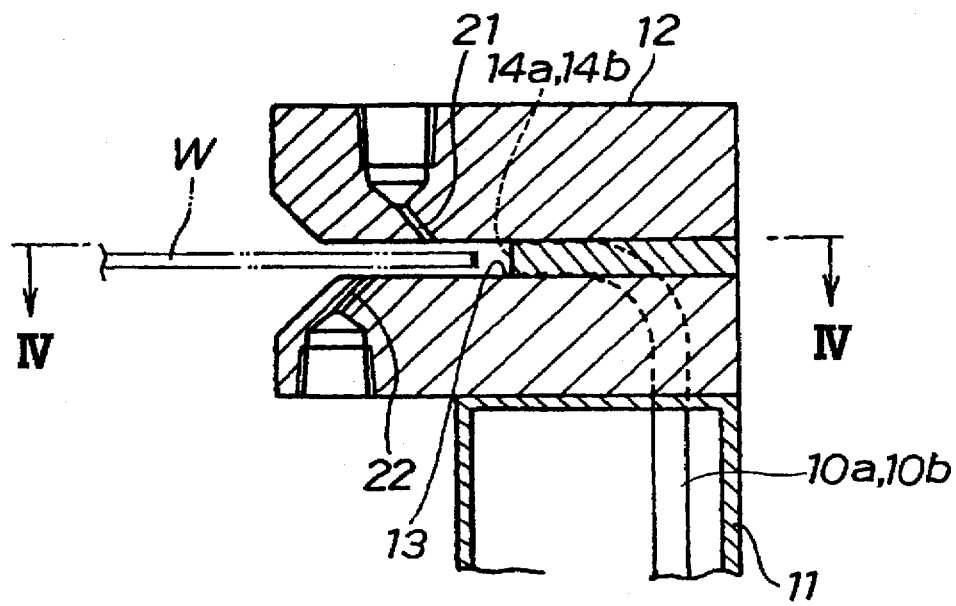
FIG. 3 is a vertical cross-sectional view of an upper portion of the removing unit.
Figure 4:
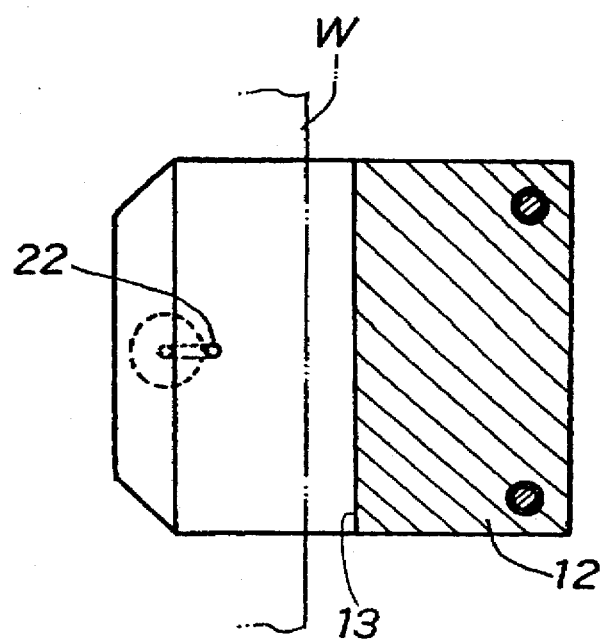
FIG. 4 is a cross-sectional view taken along line IV—IV of FIG. 3.
Figure 5:
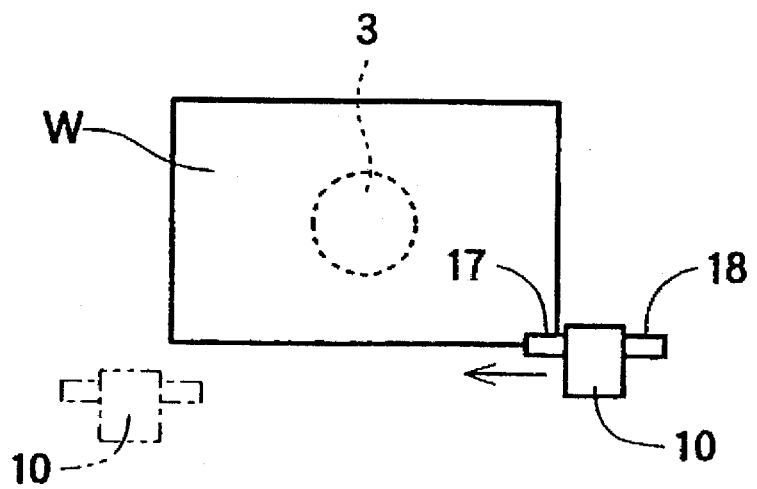
FIGS. 5(a) and 5(b) are plan views each showing the manner in which a coating is removed from an edge of a substrate by a single removing unit.
Figure 5:
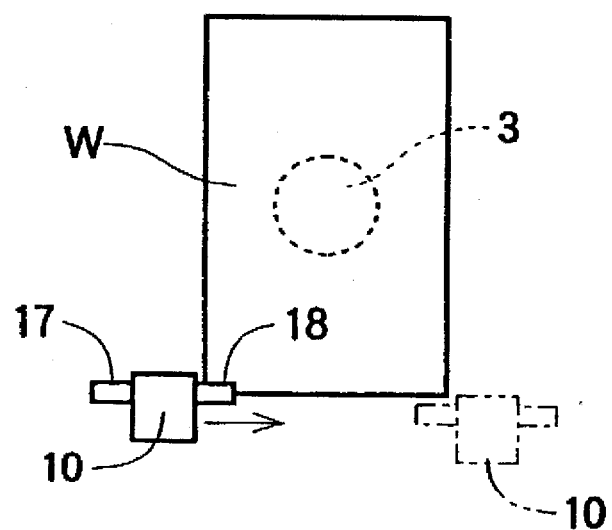

As shown in FIGS. 2 through 4, gas discharge ports 21, 22 are defined in the head 12 in respective portions thereof above and below the slot 13. The gas discharge ports 21, 22 have lower and upper ends, respectively, opening in the slot 13, and upper and lower ends, respectively, which are connected to a drying gas source (not show) through pipes 23 (only one shown in FIG. 2).

A process of dissolving and removing a photoresist film on an edge of the substrate W with a solvent will be described below with reference to FIGS. 1 through 5(a) and 5(b).

The lower surface of the substrate W at its center is held by the vacuum chuck 3, and the substrate W is positioned at the same height as the slots 13, 17, 18.

A solvent is supplied from the solvent reservoir through the pipe 10a and the solvent supply port 14a to the end of slot 13 near arm 15 so that it flows into the slot 17, and no solvent is supplied from the solvent reservoir through the pipe 10b and the solvent supply port 14b to the end of the slot 13 near the slot 18.

The removing unit 10 is now moved toward the substrate W until a right-hand end of the edge of the substrate W is inserted in the slot 17 as shown in FIG. 5(a). Thereafter, while the solvent is being supplied from the solvent supply port 14a to the slot 17, the removing unit 10 moved to the left along the edge of the substrate W to clean the edge of the substrate W from its right-hand end to the left-hand end thereof.

The slot 13 in the head 12 is connected to the non-illustrated suction device through the solvent discharge pipe 19. Therefore, the slots 13, 17 are evacuated, drawing the solvent supplied from the solvent supply port 14a through the slots 13, 17 into the solvent discharge pipe 19. The solvent is then discharged from the solvent discharge pipe 19 and retrieved.

When the solvent flows through the slot 17, it dissolves and removes a photoresist film on the edge of the substrate W which is inserted in the slot 17. As a consequence, as shown in FIG. 8(c), the photoresist film can fully be removed from upper, lower, and outer surfaces of the edge of the substrate W. Since the photoresist film can reliably be removed from the outer surface of the edge of the substrate W, any particles which would otherwise be generated by a remaining photoresist deposit are greatly reduced, and a yield of integrated circuits on the substrate W is increased.

It is preferable that the solvent flow through the slot 17 in the same direction as the direction in which the removing unit 10, is moved or in other words that the direction in which the solvent flows be opposite to the direction in which the substrate W moves with respect to the removing unit 10. Since the solvent is newly supplied from the solvent supply port 14a constantly to the edge of the substrate W as it moves toward the solvent supply port 14a, the solvent is effectively applied to the edge of the substrate W to dissolve and remove the photoresist film therefrom efficiently. The amount of solvent needed to dissolve and remove the photoresist film may therefore be smaller than the amount of solvent used by the less efficient conventional apparatus. Since the photoresist film on the edge of the substrate W is brought into contact with a fresh supply of solvent at all times, the photoresist film can be removed highly effectively from the edge of the substrate W.

The edge of the substrate W from which the photoresist film has been removed by the solvent is dried by a drying gas supplied from the gas supply ports 21, 22 which are positioned downstream of the slot 17 and the solvent supply port 14a. The dried edge of the substrate W remains dry because no solvent is supplied from the solvent supply port 14b which is positioned behind or downstream of the gas supply ports 21, 22 while the removing unit 10 is moving to the left with respect to the substrate W.

After the photoresist film has been removed from the edge of the substrate W, the removing unit 10 is retracted away from the substrate W as indicated by the imaginary lines in FIG. 5(a). Thereafter, the substrate W is returned 90° as shown in FIG. 5(b). The supply of the solvent from the solvent supply port 14a to the end of the slot 13 near the slot 17 is stopped, and the solvent is supplied from the solvent supply port 14b to the opposite end of the slot 13 near the slot 18.

The removing unit 10 is moved toward the substrate W until a left-hand end of the edge of the substrate W which now confronts the removing unit 10 is inserted in the slot 18 as shown in FIG. 5(b). Thereafter, while the solvent is being supplied from the solvent supply port 14b to the slot 18, the removing unit 10 is moved to the right along the edge of the substrate W to clean the edge of the substrate W from its left-hand end to the right-hand end thereof. The cleaned edge of the substrate W is dried by the drying gas supplied from the gas supply ports 21, 22 which are positioned downstream of the slot 18 and the solvent supply port 14b. The dried edge of the substrate W remains dry because no solvent is supplied from the solvent supply port 14a which is positioned behind or downstream of the gas supply ports 21, 22 while the removing unit 10 is moving to the right with respect to the substrate W.

The removing unit 10 can efficiently clean and dry two edges of the substrate W while it is moving in one reciprocating cycle.

The apparatus according to the present invention may have a pair of removing units each identical to the moving unit 10 shown in FIGS. 1 through 4.

Figure 6:
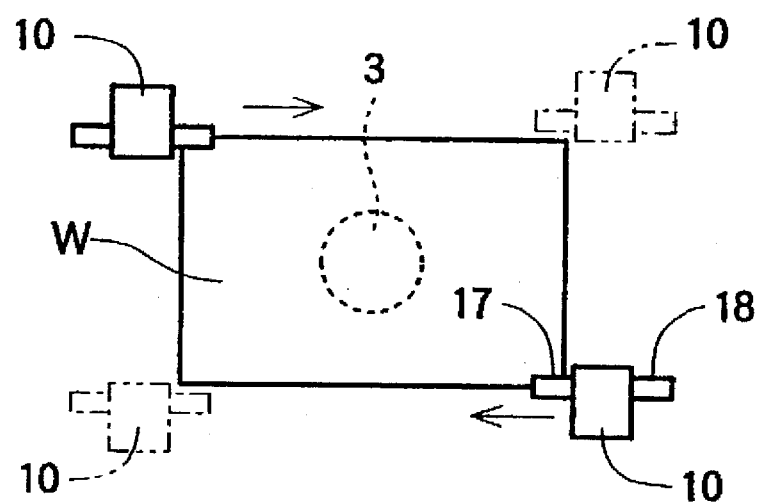
FIGS. 6(a) and 6(b) are plan views each showing the manner in which a coating is removed from an edge of a substrate by a pair of removing units.
Figure 6:
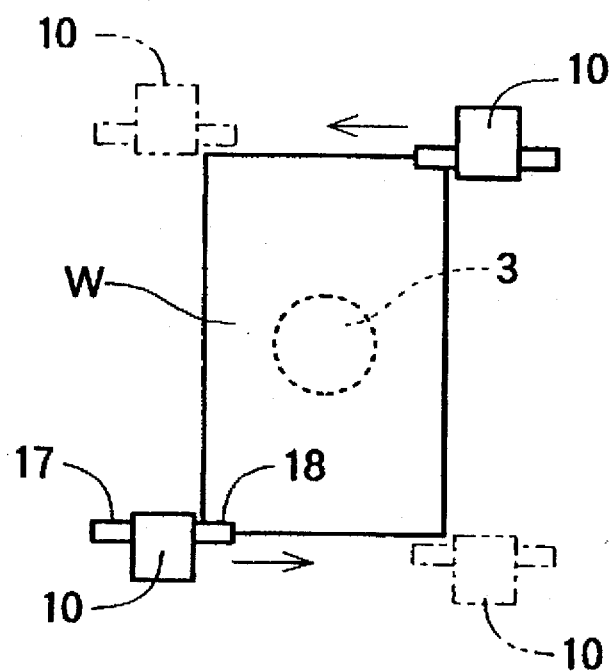

FIGS. 6(a) and 6(b) show a process of dissolving and removing a photoresist film on opposite edges of the substrate W with such a pair of removing units 10. First, as shown in FIG. 6(a), the removing units 10 are moved multaneously in opposite directions along opposite edges of the substrate W to remove a photoresist film therefrom. Then, the substrate W is turned 90°, and the removing units 10 are moved simultaneously in opposite directions along other opposite edges of the substrate W to remove a photoresist film therefrom. The apparatus with the two removing units 10 is capable of removing a photoresist film from the edges of the substrate W in a shorter period of time.

Figure 7:
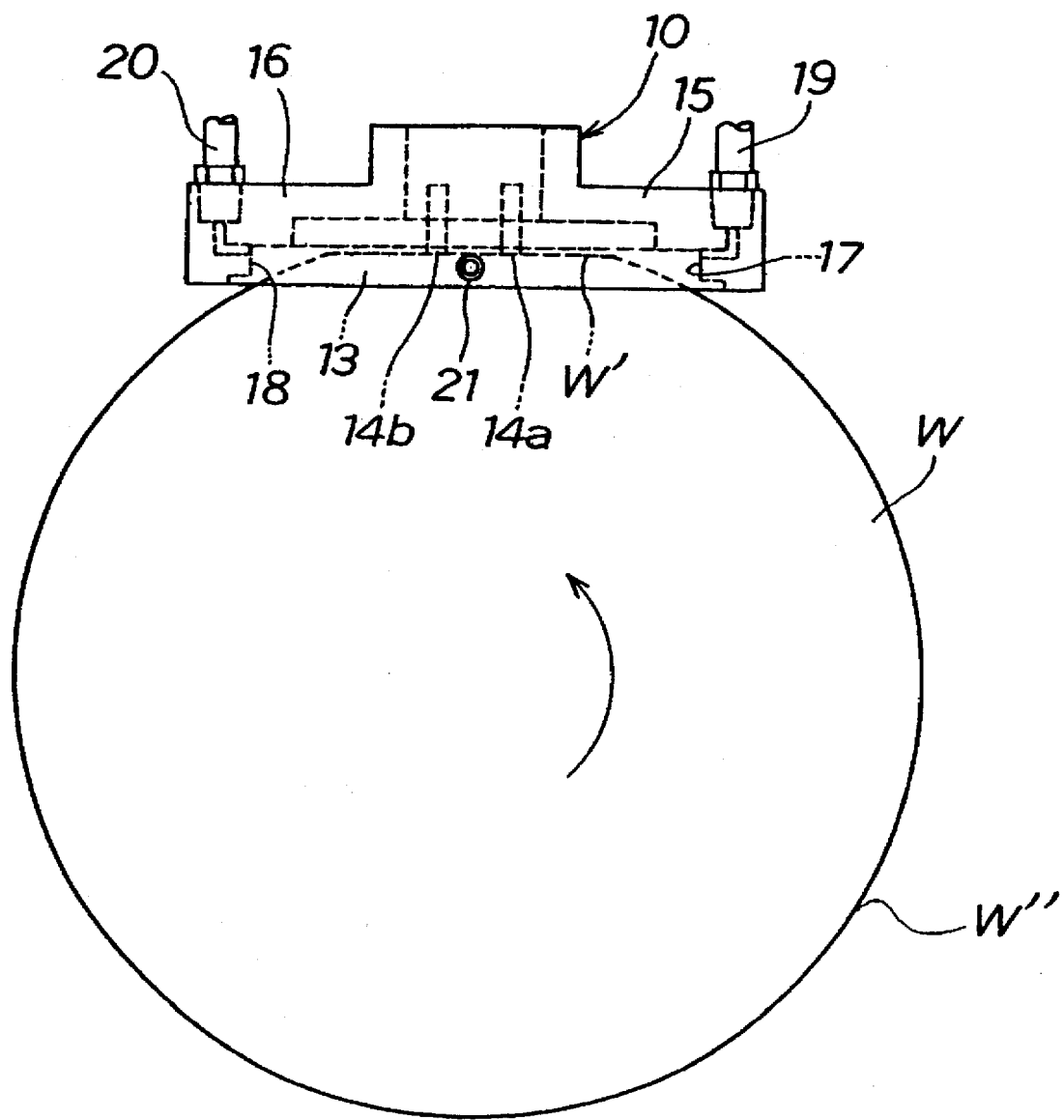
FIG. 7 is a plan view showing the manner in which a coating is removed from an edge of a semiconductor wafer by the apparatus according to the present invention.

FIG. 7 shows the manner in which the apparatus according to the present invention is used to remove a photoresist film from an edge of a circular semiconductor wafer W. The apparatus shown in FIG. 7 is basically the same as the apparatus shown in FIGS. 1 through 4, with the parts of the apparatus being denoted by reference numerals identical to those of the apparatus shown in FIGS. 1 through 4.

The semiconductor wafer W, which is of a general circular nature, has a linear orientation flat edge W' for positioning the semiconductor wafer W and an arcuate edge W'" contiguous to the linear orientation flat edge W'. For cleaning the edge of the semiconductor wafer W, the removing unit 10 is moved along the linear orientation flat edge W' to remove a photoresist film therefrom while the semiconductor wafer W is held at rest. Then, the removing unit 10 is held at rest, and the semiconductor wafer W is rotated about its own axis to allow the removing unit 10 to remove a photoresist film from the remaining arcuate edge of the semiconductor wafer W.

In the illustrated embodiments, the two arms 15, 16 extend in opposite directions from the head 12 and have the respective slots 17, 18 for passing the solvent therethrough. However the removing unit may have a single arm with a slot defined therein.

The head 12 may have another gas discharge port positioned upstream of the solvent supply port which supplies a solvent while the removing unit 10 is moving with respect to the substrate W. A drying gas ejected from the gas discharge port thus positioned is effective to prevent the solvent after it has dissolved a photoresist film from flowing toward the center of the substrate W.

A test was conducted on the apparatus according to the present invention to remove a photoresist film from one edge of a square substrate having a size of 600×600 mm. In the test, the apparatus according to the present invention consumed 20 to 30 cc of solvent and took 20 seconds in cleaning the edge of the square substrate, whereas a conventional apparatus consumed 200 to 300 cc of solvent and took about 40 seconds in cleaning the edge of the square substrate.

Because the apparatus according to the present invention removes a photoresist film from an edge of a substrate while the substrate is kept horizontally, the apparatus can smoothly receive a substrate from and transfer a substrate to other processing apparatus, and hence can easily be incorporated in a continuous processing line for fabricating integrated circuits or the like.

Although there have been described what are at present considered to be the preferred embodiments of the invention, it will be understood that the invention may be embodied in other specific forms without departing from the essential characteristics thereof. The present embodiment are therefore to be considered in all respects as illustrative, and not restrictive. The scope of the invention is indicated by the appended claims rather than by the foregoing description.

What is claimed is:

1. A method of removing a coating from an edge of a substrate, comprising the steps of:
   supplying a solvent into a slot in a removing unit;
   passing the solvent in the slot in the removing unit;
   horizontally inserting a portion of an edge of a substrate in the slot such that the edge portion is immersed entirely in the solvent in the slot; and
   thereafter, moving the removing unit along the edge of the substrate to remove a coating from the edge of the substrate.

2. A method according to claim 1, wherein said solvent is passed in the slot in a direction which is the same as a direction in which the removing unit is moved along the edge of the substrate.

3. A method according to claim 2, wherein said substrate is of a rectangular shape;
   said inserting step involves moving the removing unit toward said substrate until the edge of the substrate is inserted horizontally into said slot;
   said method further comprises the steps of;
   moving the removing unit away from the substrate after the coating has been removed from the edge of the substrate;
   turning the substrate by 90°;
   moving the removing unit toward said substrate until another edge of the substrate is inserted horizontally into said slot; and
   thereafter, moving the removing unit along said another edge of the substrate to remove a coating from said another edge of the substrate.

4. A method according to claim 2, wherein said substrate is of a substantially circular shape including a linear orientation flat edge and an arcuate edge continuous thereto;
   said moving step involves moving the removing unit along the linear orientation flat edge of the substrate to remove a coating from the linear orientation flat edge while the substrate is being held at rest; and
   rotating the substrate to allow the removing unit to remove a coating from the arcuate edge of the substrate while the removing unit is being held at rest.

5. A method according to claim 1, wherein said substrate is of a rectangular shape;
   said inserting step involves moving the removing unit toward said substrate until the edge of the substrate is inserted horizontally into said slot;
   said method further comprising the steps of:
   moving the removing unit away from the substrate after the coating has been removed from the edge of the substrate;
   turning the substrate by 90°;
   moving the removing unit toward said substrate until another edge of the substrate is inserted horizontally into said slot; and
   thereafter, moving the removing unit along said another edge of the substrate to remove a coating from said another edge of the substrate.

6. A method according to claim 1, wherein said substrate is of a substantially circular shape including a linear orientation flat edge and an arcuate edge contiguous thereto;
   said moving step involves moving the removing unit along the linear orientation flat edge of the substrate to remove a coating from the linear orientation flat edge while the substrate is being held at rest; and
   rotating the substrate to allow the removing unit to remove a coating from the arcuate edge of the substrate while the removing unit is being held at rest.

7. A method according to claim 1, further comprising the step of:
   applying a drying gas to the edge of the substrate downstream of said slot with respect to a direction in which the removing unit is moved along the edge of the substrate.

8. A method according to claim 1, further including the step of discharging the solvent from an end of the slot after the solvent has been passed along the slot.

9. An apparatus for removing a coating from an edge of a substrate, comprising:
   a base;
   a substrate holder mounted on said base, for holding a substrate;
   a removing unit for removing a coating from an edge of the substrate, said removing unit being mounted on said base for movement relative to said substrate holder;
   said removing unit having a slot for horizontally receiving a portion of the edge of the substrate, and a solvent supply port opening into said slot for supplying a solvent into said slot such that the portion of the substrate edge is entirely immersed in the solvent when the edge portion is received in the slot, to thereby dissolve and remove a coating from the edge of the substrate;
   the slot containing the solvent supplied therein; and
   means for drawing the solution in and along said slot.

10. An apparatus according to claim 9, further comprising means on said base for guiding said removing unit to move along the edge of the substrate which is horizontally received in said slot.

11. An apparatus according to claim 10, wherein said removing unit comprises a unit body movably mounted on said base and a pair of arms extending from said unit body in opposite directions, respectively, said slot being defined in said arms, and a pair of solvent discharge pipes connected to distal ends of said arms in communication with said slot, said solvent supply port being defined in said unit body.

12. An apparatus according to claim 11, wherein said unit body has a gas discharge port defined therein in communication with said slot, for applying a drying gas to the edge of the substrate.

13. An apparatus according to claim 9, further comprising means for discharging the solvent after it has been drawn along the slot.

14. An apparatus according to claim 6, wherein said removing unit also includes gas discharge means for applying a drying gas to the edge of the substrate downstream of said slot with respect to a direction in which the removing unit is moved along the edge of the substrate.

15. An apparatus for removing a coating from an edge of a substrate, comprising:

a substrate holder for holding a substrate;

a removing unit for removing a coating from an edge of the substrate which is held by said substrate holder;

said removing unit having a slot for horizontally receiving a portion of the edge of the substrate, and a solvent supply port opening into said slot for supplying a solvent into said slot such that the edge portion is entirely immersed in the solvent in the slot when the edge portion is received in the slot, to thereby dissolve and remove a coating from the edge of the substrate;

said slot containing the solvent supplied therein; and means for guiding said removing unit to move along the edge of the substrate while the solvent supplied from said solvent supply port is being applied to the edge of the substrate in said slot.

16. An apparatus according to claim 15, wherein said removing unit has a gas discharge port for applying a drying gas to the edge of the substrate downstream of said slot with respect to a direction in which the removing unit is moved along the edge of the substrate.

17. An apparatus for removing a coating from an edge of a substrate, comprising:

means for supporting a substrate in a horizontal orientation;

means for removing a coating from an edge of the substrate, said removing means including a member with a slot defined therein for receiving a portion of the edge of the substrate, and means for passing a solvent along the slot;

the portion of the substrate edge being entirely immersed in the solvent when the portion is received in the slot;

the slot containing the solvent passed therealong; and means for moving at least one of said substrate holding means and said removing means relative to the other.

18. An apparatus according to claim 17, wherein said slot is shaped for horizontally receiving the edge of the substrate, and said moving means moves said member along the edge of the substrate which is horizontally received in said slot as said solvent passing means passes a solvent in the slot to remove the coating from the edge of the substrate.

19. An apparatus according to claim 17, wherein said moving means moves said member toward and away from said substrate holding means such that the substrate may be horizontally received in and horizontally retracted from said slot.

20. An apparatus according to claim 19, wherein said moving means further moves said member along the edge of the substrate which is horizontally received in said slot.

21. An apparatus according to claim 17, wherein said solvent passing means includes a solvent supply port opening into said slot for supplying a solvent into said slot to dissolve and remove coating from the edge of the substrate which is horizontally received in said slot, and means for drawing the solution in and along said slot.

22. An apparatus according to claim 17, further including means for applying a drying gas to the edge of the substrate downstream of said slot with respect to a direction in which the removing means is moved along the edge of the substrate.

* * * * *

UNITED STATES PATENT AND TRADEMARK OFFICE
CERTIFICATE OF CORRECTION

| | | |
|---|---|---|
| PATENT NO. : | 5,688,411 | Page 1 of 2 |
| DATED : | 18 November 1997 | |
| INVENTOR(S) : | Junji Kutsuzawa, Yoshihito Kai, Hidenori Miyamoto, Futoshi Shimai | |

It is certified that error appears in the above-indentified patent and that said Letters Patent is hereby corrected as shown below:

On the cover page, in the Abstract, line 4, change "parts" to --ports--.

Column 1, line 25, change "occur" to --occurs--;
    line numbered approximately 54, change "arm" to --arms--.

Column 2, line 8, after "edge" insert --of--;
    line numbered between 42 & 43, before "thereafter" insert a comma;
    line 62, change "Of" to --of--.

Column 3, line 26, after "coating" insert --from--;
    line numbered approximately 39, change "unit in" to --unit is--;
    line numbered between 40 & 41, before "horizontally" insert --is--;
    line 67, change the period to a semicolon.

Column 4, line numbered between 29 & 30, after "substrate" insert --W--;
    line numbered between 31 & 32, change "thereof" to --thereon--;
    line 55, change "27" to --17--;
    line 57, change "A Solvent" to --A solvent--;
    line 66, change "show" to --shown--.

Column 5, line numbered between 18 & 19, before "moved" insert --is--;
    line numbered approximately 42, change "10, is moved" to --10 is moved,--;
    line numbered approximately 51, change "may therefore be" to --may, therefore, be--.

Column 6, line numbered between 33 & 34, change "multaneously" to --simultaneously--;
    line numbered between 43 & 44, before "circular" insert --substantially--;
    line 59, after "edge" insert --W"--;

UNITED STATES PATENT AND TRADEMARK OFFICE
CERTIFICATE OF CORRECTION

PATENT NO. : 5,688,411
DATED : 18 November 1997
INVENTOR(S) : Junji Kutsuzawa, Yoshihito Kai, Hidenori Miyamoto, Futoshi Shimai It is certified that error appears in the above-indentified patent and that said Letters Patent is hereby corrected as shown below:

Column 6 (cont.), line 60, change "water" to --wafer--.

Column 7, line 6, before "test" insert --comparative--;
   line 7, after "invention" insert --and on a conventional apparatus--;
   line 11, change "a" to --the--;
   line numbered between 16 & 17, after "horizontally" insert --positioned--;
   line numbered between 25 & 26, change "embodiment" to --embodiments--;
   line 30, change "What is claimed is:" to --We claim:--;
   line 65, change "continuous" to --contiguous--.

Column 8, line 60, change "solution" to --solvent--.

Column 9, line 12, change "6" to --9--.

Signed and Sealed this

Tenth Day of March, 1998

Attest:

BRUCE LEHMAN

*Attesting Officer*   Commissioner of Patents and Trademarks